United States Patent [19]
Yumoto

[11] Patent Number: 6,015,523
[45] Date of Patent: *Jan. 18, 2000

[54] PROCESS FOR PRODUCING ELECTRONIC PARTS

[75] Inventor: Tetsuo Yumoto, Saitama, Japan

[73] Assignee: Sankyo Kasei Kabushiki Kaisha, Tokyo, Japan

[*] Notice: This patent is subject to a terminal disclaimer.

[21] Appl. No.: 08/993,020

[22] Filed: Dec. 18, 1997

[51] Int. Cl.⁷ .............................. B29C 33/52; B29C 59/00
[52] U.S. Cl. ........................ 264/129; 264/221; 264/317; 264/DIG. 44
[58] Field of Search .................................. 264/129, 221, 264/317, DIG. 44, 135, 139; 249/62; 427/304–307; 438/694, 703, 964, 763

[56] References Cited

U.S. PATENT DOCUMENTS

| | | | |
|---|---|---|---|
| 3,882,220 | 5/1975 | Ryder | 264/221 |
| 4,812,275 | 3/1989 | Yumoto | 264/129 |
| 4,812,353 | 3/1989 | Yumoto | 428/172 |
| 4,997,724 | 3/1991 | Suzuki et al. | 428/626 |
| 5,185,185 | 2/1993 | Nishizawa et al. | 427/304 |
| 5,217,571 | 6/1993 | Rosenau et al. | 156/668 |
| 5,342,654 | 8/1994 | Koizumi et al. | 427/307 |

Primary Examiner—Jan H. Silbaugh
Assistant Examiner—Suzanne E. Mason
Attorney, Agent, or Firm—Foley & Lardner

[57] ABSTRACT

An electronic part, which has a complicated internal configuration and has a movable part rotatably and movably accommodated therein, is integrally molded without dividing the configuration into a plurality of sections to carry out a number of molding operations for separate sections of the electronic part, thereby reducing the cost and enhancing the quality of the electronic part. The manufacturing process comprises producing a core for the injection molding by the injection molding of a polyvinyl alcohol-based resin containing an oxyalkylene group, producing a second stage product, which has the core inserted therein so as to be partly exposed, by the injection molding of a metallization-grade aromatic polyester liquid crystalline polymer, which contains a catalyst, producing a third stage product so that the second stage product is partly exposed by the injection molding of a nonmetallization-grade aromatic polyester liquid crystalline polymer, immersing the third stage product in hot water so that the core is dissolved in hot water, etching the surface of the circuit pattern forming area, which is exposed on the surface and is made from the metallization-grade polymer, and then metallizing the etched surface so that an electrically conductive circuit is formed thereon. In the above-described process, the movable part is embedded in the core.

14 Claims, 17 Drawing Sheets

PROCESS FOR PRODUCING ELECTRONIC PARTS

BACKGROUND OF THE INVENTION

The present invention relates to a process for producing electronic parts, which are made from a synthetic resin and have an elaborate and complicated internal configuration, such as external bottom cases for connectors, switches, portable telephones, video cameras, and the like, and also relates to electronic parts produced thereby.

DESCRIPTION OF THE RELATED ART

A conventional process for producing an electronic part, which is made from a synthetic resin and has an elaborate and complicated internal configuration, comprises producing a plurality of separate sections of an electronic part having different configurations by injection molding and joining the predetermined surfaces of these sections by means of heat or high-frequency wave to form an electronic part as a final product.

However, the above-described conventional process has following disadvantages: That is, different molds are required for each section of the electronic part, which increases the production cost of molds as well as the number of production steps; the number of steps for joining the plurality of different sections increases, which is troublesome; and inferior strength at the joining surfaces between the sections makes it difficult to produce an electronic part having a uniform strength as a whole.

SUMMARY OF THE INVENTION

An object of the present invention is to solve the above-described problems and to provide a process for producing a high-quality electronic part, even if the part has an elaborate and complicated internal configuration and even if these parts have a movable part rotatably and movably accommodated therein, by means of an integral injection molding operation without dividing the configuration into a plurality of sections so as to adopt a smaller number of molds and steps, thereby significantly reducing the production cost, and to eliminate the junctions of the sections so that the superior electronic part having a uniform strength can be produced, and to provide an electronic part produced thereby.

Another object of the present invention is facilitate the production process by using a core made of a resin material which is easily dissolved in hot water and has a biodegradability so as to be returned to nature without polluting the environment.

Still another object of the present invention is to produce an injection-molded article having a complicated internal configuration with precision by comprising, for the material of the electronic part, a material which can be molded without melting the core for injection molding so as to exhibit an excellent release from the core without forming observable burrs.

Still a further object of the present invention is to ensurely dissolve away the core for injection molding and to perform heat treatment at the circuit forming stage, by comprising a material which is excellent in heat resistance for an electronic part.

Still a further object of the present invention is to easily form a circuit exclusively on the desired site.

Still a further object of the present invention is to provide an electronic part at low cost which has an elaborate and complicated internal configuration with superior quality and high reliability and to provide electronic parts, in which an electronic device can be easily mounted on a circuit by soldering, by the above-described process.

The first feature of the manufacturing process according to the present invention is characterized by the five molding steps, which include a first molding step for producing a core for the injection molding, a second molding step for producing a second stage product, a third molding step for producing a third stage product, a fourth molding step for producing a fourth stage product, and a fifth molding step for producing an electroconductive circuit.

The above molding steps are explained in details hereinafter. At the first molding step, a core to be used in the injection molding is produced by injecting a resin, which has a melting point lower than that of a plastic material constituting the electronic parts and has a solubility in water that ensures the easy dissolution in hot water, into a mold cavity corresponding to the internal configuration of the electronic part. Examples of the resin, which has a melting point lower than that of a plastic material constituting the electronic parts and has a solubility in water that ensures the easy dissolution in hot water, include a polyvinyl alcohol-based resin containing an oxyalkylene group.

The second injection molding step is performed by inserting the above-described core into a mold cavity, which corresponds to the external configuration having a ridgy projection for a circuit pattern to be formed on the surface of an electronic part, and thereafter injecting a highly heat-resistant thermoplastic resin, whose surface can be roughened by an alkali and which contains a catalyst, to thereby produce a second stage product which has the core inserted therein and has a ridgy projection as a circuit pattern forming area on the surface thereof and has an opening for discharge. Examples of the highly heat-resistant thermoplastic resin, whose surface can be roughened by an alkali and which contains a catalyst, include an aromatic polyester liquid crystalline polymer containing a catalyst.

In fact, at the time when the present inventors considered the use of the liquid crystalline polymer at the second molding step of the process, the following problems were predicted to arise: Because the liquid crystalline polymer employed at the second molding step for producing the second stage product is injected at a resin temperature from 290 to 350-C., which is far higher the melting point, i.e., a temperature from 190 to 200-C., of the polyvinyl alcohol-based resin as a material for the core, a precisely molded second stage might not be obtained due to surface fusion and deformation of the core or intermixing of the core with the liquid crystalline polymer by fusion.

Contrary to the prediction, however, the above-mentioned molding step has proved to be well practicable as a result of experiments, because the core did not cause the problems, namely, deformation, core fusion, or adhesion to the second stage product. It is hypothesized that, since the liquid crystalline polymer exhibits a crystalline property even in a molten state, and exhibits a molecular structure which is elongated in the flow direction at the time of molding, and which is characterized by a peculiar surface called a skin layer, and since the solidification by cooling of the liquid crystalline polymer is very rapid and the fluidity of the liquid crystalline resin is very high relative to common resins, the injection-injecting of the liquid crystalline polymer into the mold cavity is performed very rapidly. Presumably, a combination of these features contributes to the advantageous results.

From the above-described viewpoint, the present inventors have decided to employ a metallization-grade aromatic polyester liquid crystalline polymer (hereinafter referred to as a liquid crystalline polymer), which contains a catalyst, as a highly heat-resistant thermoplastic resin, whose surface can be roughened by an alkali and which contains a catalyst, for example, "VECTRA METALLIZATION-GRADE C810" manufactured by Polyplastics Co., Ltd. The use of the above-mentioned material in the present invention is advantageous, because it is possible to obtain the second stage product with precision without melting and deforming the inserted core and because the presence of the skin layer provides an excellent release of the polymer from the core at the fourth molding step when the inserted core is dissolved away after the third molding step.

The third molding step is performed by inserting the second stage product into a mold cavity corresponding to the external configuration of the electronic part and thereafter injecting an alkali-resistant, highly heat-resistant thermoplastic resin into the cavity encircling the second stage product by injection molding to produce a third stage product whose entire surface except the exposed circuit pattern forming area is coated with the alkali-resistant, highly heat-resistant thermoplastic resin. Examples of the alkali-resistant, highly heat-resistant thermoplastic resin include polyphenylene sulfide.

At the fourth molding step, a fourth stage product is produced by heating the third stage product in hot water so that the core is dissolved away in hot water.

At the fifth molding step, the exposed surface of the circuit pattern forming area on the external peripheral surface of the fourth stage product is metallized after surface-roughening treatment thereof so that an electrically conductive circuit is formed thereon.

The second feature of the aforesaid manufacturing process of the present invention is the same as the feature described in the first feature of the manufacturing process of the present invention except that the second stage product of the second molding step is produced by the injection molding of a highly heat-resistant thermoplastic resin whose surface can be roughened by an acid and which contains a catalyst and the third stage product is produced by the injection of an acid-resistant, highly heat-resistant thermoplastic resin.

The third feature of the aforesaid manufacturing process of the present invention is the same as the feature described in the first feature except that the process comprises the following five steps, which include the first molding step for producing a cylindrical movable part and the second molding step for producing a core for the injection molding, which core is produced by use of a polyvinyl alcohol-based resin containing an oxyalkylene group and has a structure having a cylindrical hollow portion and having the above-mentioned movable part embedded so as to surround the external peripheral surface of the cylindrical hollow portion.

The third molding step is performed by inserting the above-described core into a mold cavity and injecting a highly heat-resistant thermoplastic resin, which is a nonmetallization-grade resin, to produce a second stage product which is of a configuration having a concave groove as a circuit pattern forming area on the surface of the electronic part, accommodating the core partly exposed and having a central axis through the hollow portion.

The fourth molding step is performed by inserting the second stage product into a mold cavity and injecting a highly heat-resistant thermoplastic resin, which is a metallization-grade resin and contains a catalyst, to produce a third stage product having the concave groove filled with this injected resin which serves as a circuit pattern forming area.

At the fifth molding step, a fourth stage product is produced by heating the third stage product in hot water so that the core is dissolved away in hot water.

At the sixth molding step, the exposed surface of the circuit pattern forming area on the external peripheral surface of the fourth stage product is metallized after surface-roughening treatment thereof so that an electrically conductive circuit is formed thereon.

The fourth feature of the manufacturing process of the present invention is the same as that described in the third feature of the manufacturing process of the present invention except that the third molding step comprises inserting the above-mentioned core into the mold cavity and thereafter injecting a highly heat-resistant, metallization-grade thermoplastic resin, which contains a catalyst, to produce the second stage product having a configuration, which has a ridgy projection as a circuit pattern forming area on the surface of the electronic part and accommodates the core partly exposed and has a central axis through the hollow portion. Further, the fourth feature of the aforesaid manufacturing process of the present invention is characterized in that the fourth molding step comprises inserting the second stage product into the mold cavity and thereafter injecting a highly heat-resistant, nonmetallization-grade thermoplastic resin to produce the third stage product, which has in the surface thereof the exposed surface of the ridgy projection of the second stage product.

The electronic parts produced according to the above-described process are characterized in that a high-quality molded article, which has an electroconductive circuit on the surface and a complicated internal configuration comprising a movable part internally accommodated in a rotatable and movable manner, can be integrally produced and in that an electronic device can be easily mounted on the circuit by means of soldering.

BRIEF DESCRIPTION OF THE DRAWINGS

FIG. 1 shows a core for the injection molding which is produced at the first molding step, wherein (A) is a top view; (B) is a side view; (C) is a front view; and (D) is a cross-sectional view taken along the line 1—1.

FIG. 2 shows a second stage product which has the core inserted therein and which is produced at the second molding step, wherein (A) is a top view; (B) is a side view; (C) is a front view; and (D) is a cross-sectional view taken along the line 2—2.

FIG. 3 shows a third stage product after the dissolution step, wherein (A) is a top view; (B) is a side view; (C) is a front view; and (D) is a cross-sectional view taken along the line 3—3.

FIG. 4 shows a fourth stage product, wherein (A) is a top view; (B) is a side view; (C) is a front view; and (D) is a cross-sectional view taken along the line 4—4.

FIG. 5 shows an electronic part as a final product, wherein (A) is a top view; (B) is a side view; (C) is a front view; and (D) is a cross-sectional view taken along the line 5—5; (E) is a partial enlarged sectional view of (D).

FIG. 6 is a slant view illustrating the core for the injection molding which is produced at the first molding step.

FIG. 7 is a slant view illustrating the second stage product which is produced at the second molding step and has the core inserted therein.

FIG. 8 is a slant view illustrating the third stage product which has a circuit pattern forming area produced on the surface of the second stage product.

FIG. 9 is a slant view illustrating the fourth stage product which is obtained after the completion of the dissolution step.

FIG. 10 is a cross-sectional view of the fourth stage product illustrating the etched state of the area which will form a circuit pattern.

FIG. 11 is a cross-sectional view illustrating the surface of an electronic part having a circuit pattern formed thereon.

FIG. 12 is a slant view illustrating the second stage product which is produced at the second molding step and has the core inserted therein.

FIG. 13 is a slant view illustrating the third stage product in which the surface of the ridgy projection, which is to be a circuit pattern, of the second stage product is exposed.

FIG. 14 is a slant view illustrating the fourth stage product which is obtained after the completion of the dissolution step.

FIG. 15 is a cross-sectional view illustrating the etched state of the area which is to be a circuit pattern.

FIG. 16 is a cross-sectional view illustrating the surface of an electronic part having a circuit pattern formed thereon.

DETAILED DESCRIPTION OF PREFERRED EMBODIMENTS

Figure 1A:
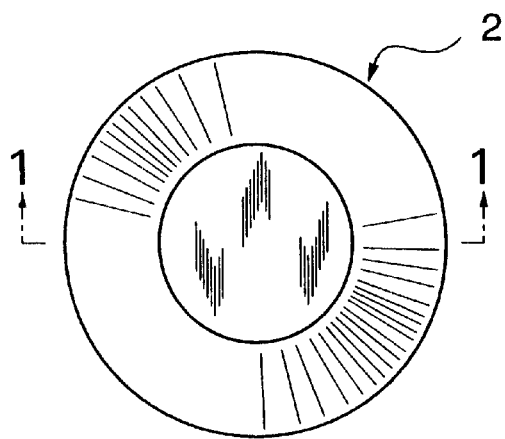
FIGS. 1–5 illustrate the manufacturing processes described in Examples 1 and 2 of the present invention.
Figure 1B:
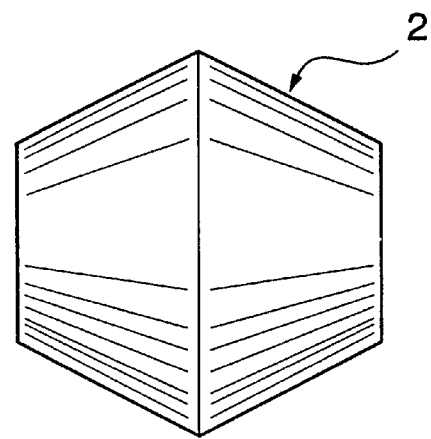
Figure 1C:
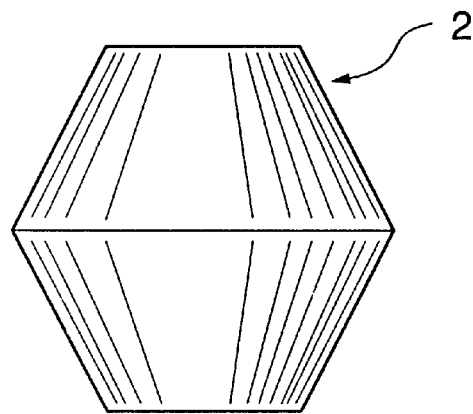
Figure 1D:
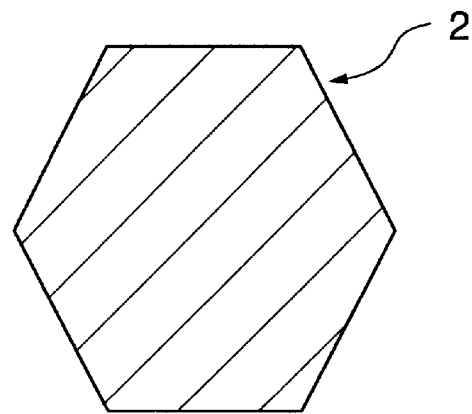

Referring now to the drawings in detail, the present invention is explained below so that the salient features will become more apparent.

EXAMPLE 1

Figure 5A:
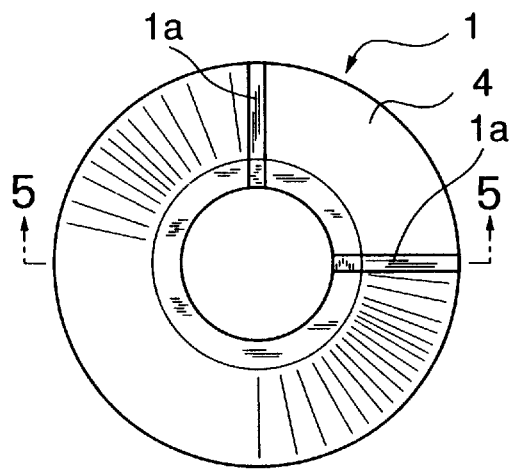
Figure 5B:
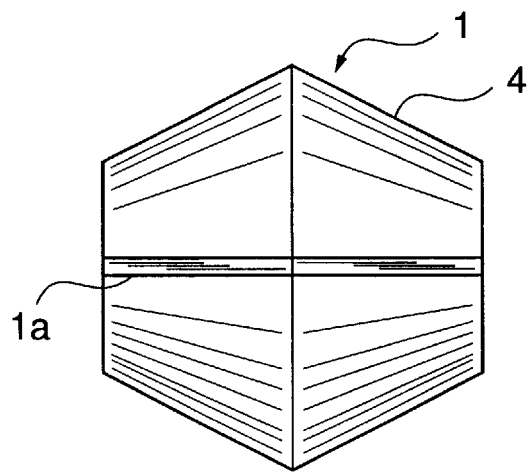
Figure 5C:
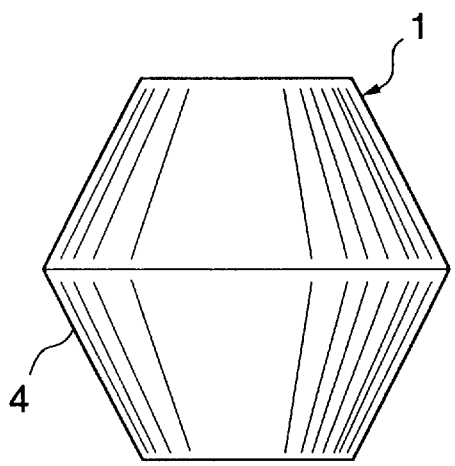
Figure 5D:
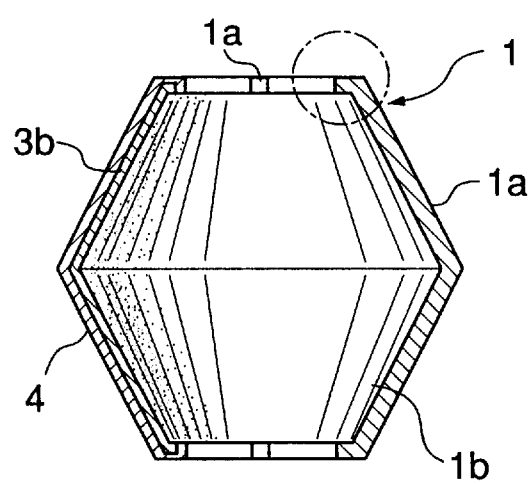
Figure 5E:
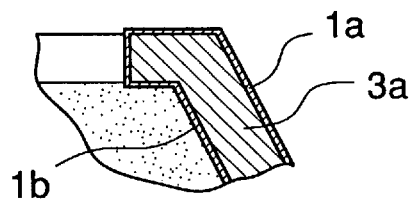

(a) FIG. 1 shows a core 2 which is produced at the first molding step and the external configuration of the core 2 corresponds to the internal configuration (see FIG. 5(D)) of the hollow space to be formed in an electronic part 1 as a final product. As shown in FIGS. 1 (A), (B), (C) and (D), the external configuration of the core 2 has a largest diameter in the middle and flat circular upper and lower surfaces. The core 2 is produced by injecting a water-soluble resin as an injection material at a predetermined injection pressure into the mold cavity created between the opposed surfaces of ordinary well-known upper and lower mold units (not shown).

As described later, since the core 2 is to be dissolved away in hot water after the third molding step, the resin constituting the core 2 is required to have a melting point lower than that of the plastic material constituting the electronic part, i.e., the material for the second stage product 3 and the third stage product 4 and to have a solubility in water so as to be easily dissolved in hot water. The polyvinyl alcohol-based resin containing an oxyalkylene group, which is exemplified by "ECOMATY AX" manufactured by Nippon Synthetic Chemical Industry Co., Ltd. and which is used in this example, is ideal in that this resin is suitable for the injection molding operation because of excellent melt-moldability, that this resin is suitable for the dissolution step because of the melting point from 190 to 200-C. and solubility in water and that this resin can be returned to nature without polluting the environment because of the biodegradability of the resin.

An example of injection molding condition at this step is given below.
Injection Material: "ECOMATY AX"
Cylinder Temperature: 210-C.
Mold Temperature: 25-C.
Injection Pressure: 900 Kg/cm2
Cooling Time: 20 seconds (b) According to the second molding step, a second stage product 3, which has the core 2 inserted therein, as shown in FIG. 2, is produced. The configuration of mold cavity, which is created by the opposed surfaces of ordinary upper and lower mold units (not shown) and which is used for the production of the second stage product 3, corresponds to the external configuration having a ridgy projection for a circuit pattern 1a (see FIGS. 5(A) and (D)) to be formed on the surface of an electronic part 1. The second stage product 3 is produced by inserting the core 2 into the mold cavity and then injecting a highly heat-resistant thermoplastic resin, whose surface can be roughened by an alkali and which contains a catalyst, at a predetermined pressure into the cavity surrounding the core 2 by injection molding.

It is imperative that the second stage product 3, which has the core 2 inserted therein, be produced by the injection molding without melting the core. In addition, the material of electronic parts is required to withstand the heat of soldering and reflow of solder. Since the electronic parts are generally exposed to an atmosphere of 240 to 280-C. for 10 to 30 seconds, an aromatic polyester liquid crystalline polymer is often utilized as a thermoplastic resin which withstands such a condition. As described above, even if a liquid crystalline polymer is employed at the second molding step, the defects such as deformation of core, core fusion and adhesion to the liquid crystalline polymer do not occur.

Figure 2A:
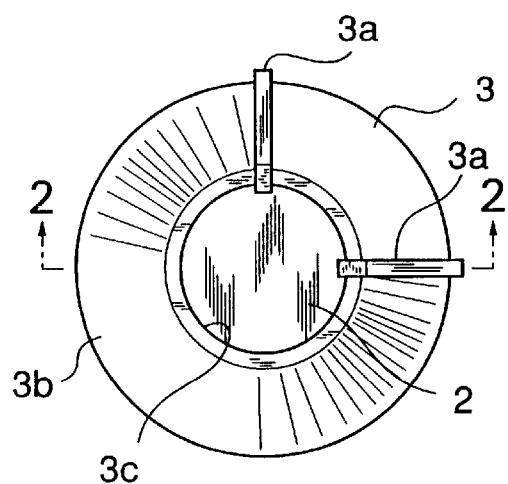
Figure 2B:
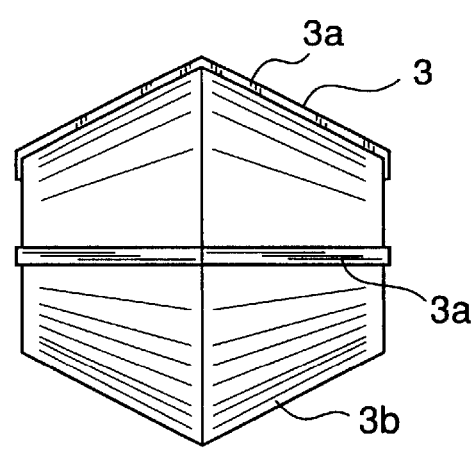
Figure 2C:
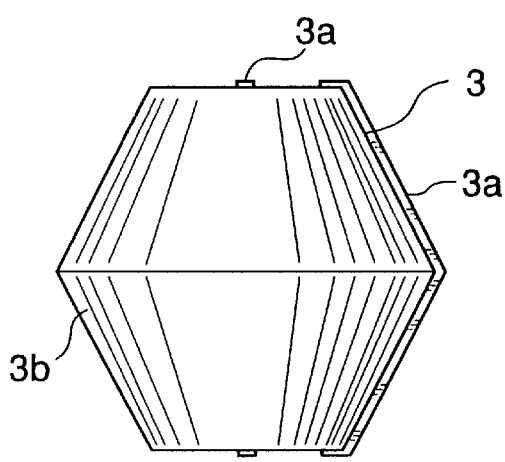
Figure 2D:
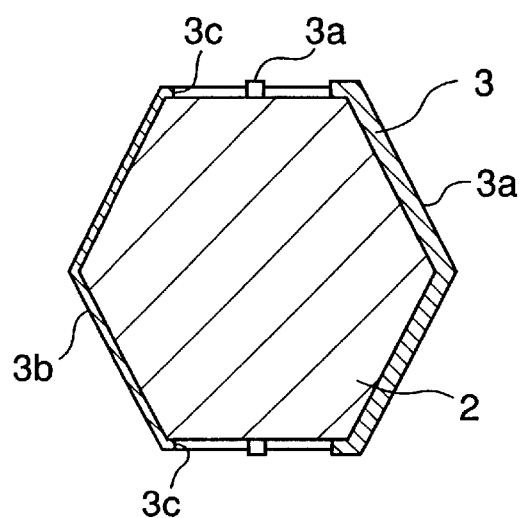

As shown in FIG. 2(A), (B) and (C), the second stage product 3 has two ridges 3a which are designed for use in the formation of circuit pattern and continue from top surface to the bottom surface on the external wall so the external wall 3b excluding the ridges has a thin wall. As shown in FIG. 2 (D), the circular upper and lower surfaces each have openings 3c serving as a discharge outlet so that the inserted core 2 is exposed at the openings 3c.

An example of injection molding condition at this step is given below.
Injection Material: "VECTRA METALLIZATION-GRADE C810"
Cylinder Temperature: 320-C.
Mold Temperature: 110-C.
Injection Pressure: 1,200 Kg/cm2
Cooling Time: 15 seconds (c) According to the third molding step, a third stage product 4, which has the second stage product 3 after the completion of the second molding step inserted therein, as shown in FIG. 3, is produced. The configuration of mold cavity, which is created by the opposed surfaces of ordinary upper and lower mold units (not shown) and which is used for the production of the third stage product 4, corresponds to the external configuration of an electronic part 1 as a final product. The third stage product 4 is produced by inserting the second stage product 3 into the mold cavity and then injecting an alkali-resistant, highly heat-resistant thermoplastic resin, e.g., polyphenylene sulfide (PPS), into the cavity encircling the second stage product 3 by injection molding.

Figure 3A:
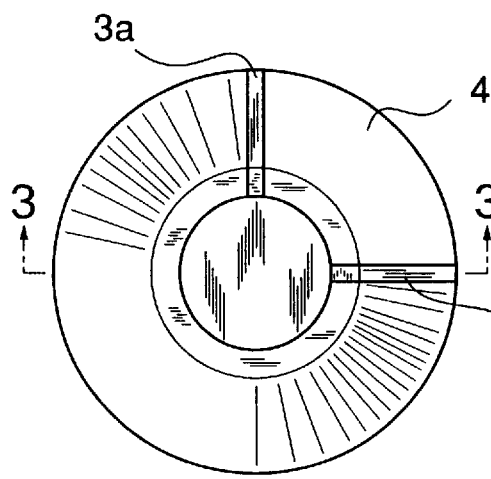
Figure 3B:
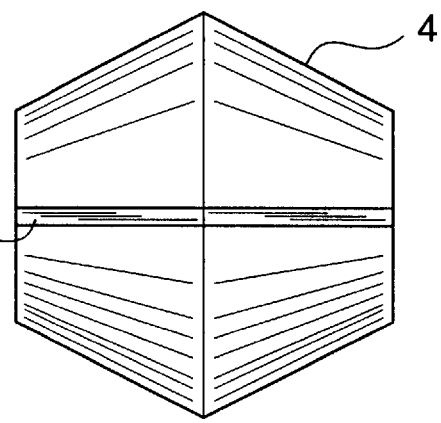
Figure 3C:
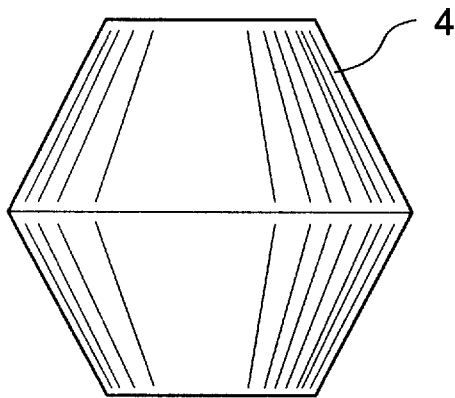
Figure 3D:
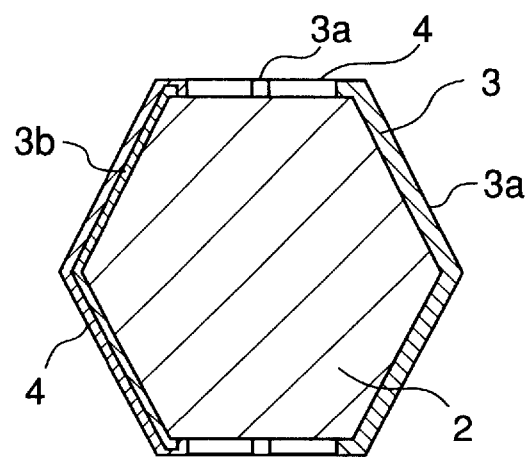

As shown in FIGS. 3(A), (B) and (C), the second stage product 3 has two ridges 3a and contains a catalyst and are designed for use in the formation of circuit pattern to continue from top surface to the bottom surface on the external wall so that the external wall 3b excluding the ridges is a thin wall laminated with a PPS coating layer, wherein the ridges 3a do not protrude from the wall 3b but are exposed at the same surface level.

An example of injection molding condition at this step is given below.
Injection Material: PPS
Cylinder Temperature: 310-C.
Mold Temperature: 140-C.
Injection Pressure: 1,000 Kg/cm2
Cooling Time: 30 seconds (d) Next, the dissolution step for dissolving away the core 2 from the third stage product 4 is explained according to FIGS. 4(A)–(D). The third stage product 4, which is produced at the third molding step, is placed in hot water and is heated to a temperature from 80 to 100-C. Since both of the above-mentioned liquid crystalline polymer "VECTRA C810"0 employed in the second molding step and the PPS employed in the third molding step are highly heat-resistant, the liquid crystalline polymer "VECTRA C810" and "PPS" undergo no change although the core 2 made from "ECOMATY AX" is dissolved away from the openings 4c into hot water by heating it to a temperature from 80 to 100-C. By this treatment, a fourth stage product 40 is produced which is hollow inside and has an internal peripheral surface 3d continuing to each of the openings 4c as a result of the dissolution of the core 2. The dissolution step, which is carried out by the dissolution of the core 2 in hot water, is an easy process as well as a non-polluting process enabling the return of "ECOMATY AX" to nature without polluting the environment because of the biodegradability.

Figure 4A:
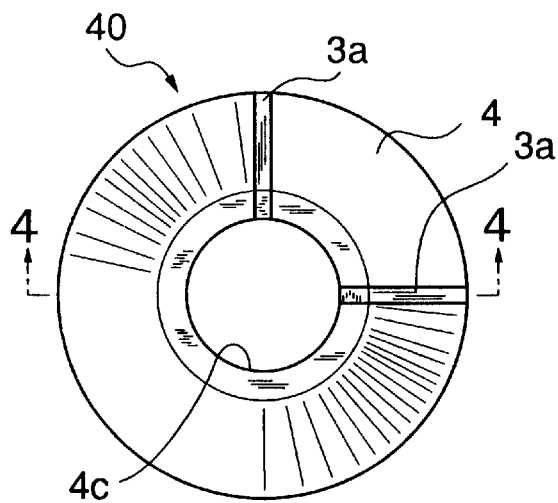
Figure 4B:
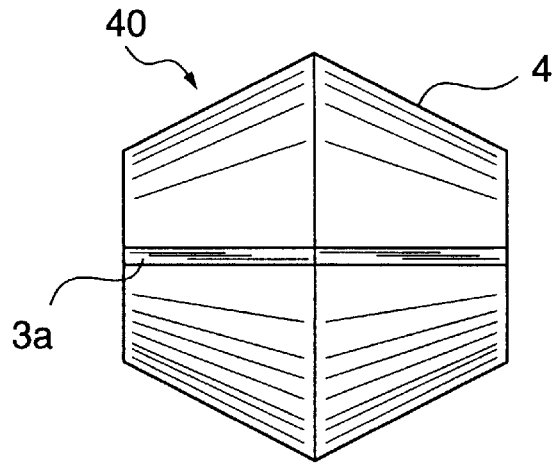
Figure 4C:
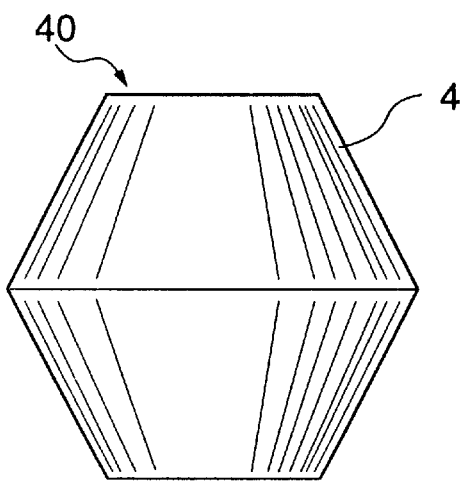
Figure 4D:
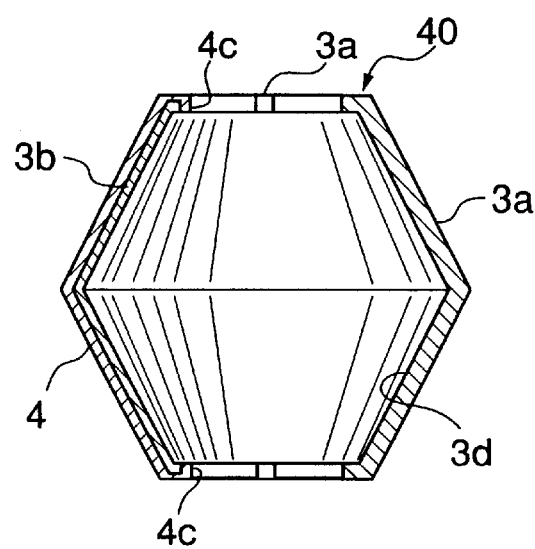

(e) Finally, the fifth molding step comprises roughening (etching) the surface of the fourth stage product 40 shown in FIG. 4(D) and thereafter forming an electroconductive circuit on the roughened surface. For example, the etching is carried out by immersing the fourth stage product 40 for a predetermined time in an alkaline aqueous solution which contains sodium hydroxide or potassium hydroxide at a predetermined concentration and is kept at a temperature from 50 to 90 C. Although the surface 3a and the internal peripheral surface 3d of the second stage product which is eroded by an alkali is etched, the surface of the fourth product 40 which is not eroded by an alkali is not etched. At the electroconductive circuit forming step, an electroconductive circuit is formed by chemically depositing a copper layer or a nickel layer on the surface 3a designed for receiving the electroconductive circuit and on the internal peripheral surface 3d, each of which surfaces is exposed and contains a catalyst, as shown in FIGS. 5 (A)–(E). By this treatment, when a circuit pattern 1a is formed as a result of the metallization of the circuit pattern forming area 3a, the internal peripheral surface 3d is simultaneously metallized to form an electroconductive layer 1b. Finally, the molded article prepared according to the procedure described above is subjected to a heat treatment for removal of water remaining inside the article to complete the electroconductive circuit forming step.

EXAMPLE 2

(a) The first molding step of Example 2 is the same as that of Example 1 illustrated by FIG. 1.

(b) At the second molding step, the second stage product 3 is made from a highly heat-resistant thermoplastic resin whose surface can be roughened by an 1 acid and which contains a catalyst, which differs from Example 1. As an example of the resin, polyethersulfone was used as the injection material to produce the second product 3.

An example of injection molding condition at this step is given below.
Injection Material: Polyethersulfone
Cylinder Temperature: 390-C.
Mold Temperature: 150-C.
Injection Pressure: 1,400 Kg/cm2
Cooling Time: 30 seconds (c) At the third molding step, the third stage product 4 is made from a highly heat-resistant thermoplastic resin which is acid-resistant, which differs from Example 1. As an example of the highly heat-resistant thermoplastic resin which is an acid-resistant resin, polyphenylene sulfide (PPS) was used as the injection material to produce the third product 4. Since the PPS resists both alkali and acid, the PPS can be used both in Examples 1 and 2. The injection molding condition for this step is the same as that for the step in Example 1.

(d) The dissolution step as the fourth molding step of Example 2 is the same as that of Example 1, and the product after this step of Example 2 is the fourth stage product 40.

(e) At the fifth molding step of Example 2, the etching treatment of the surface of the fourth stage product 40 is carried out by means of an acid, which differs from Example 1.

For example, the etching treatment is performed according to the following procedure:

First, the fourth stage product 40 is immersed for one minute in a solution comprising 90% of dimethylformamide and 10% of water. Next, the fourth stage product 40 is immersed for one minute in an aqueous solution containing GAFFAC RE610 at a concentration of 0.4 g/l and kept at 60-C. Further, the fourth stage product 40 is immersed for one minute in an aqueous solution containing 48% of sulfuric acid and kept at 60-C.

Then, the fourth stage product 40 is subjecting to an etching treatment by immersing it at 60-C. for 2 minutes in an aqueous solution comprising:
chromium trioxide 400 g/l
sulfuric acid 450 g/l
perfluoroalkylsulfonate (commercially available as "FC-98" (tradename) from 3M Corporation) 0.5 g/l.

Then the fourth stage product 40 is taken out of the above-described etching solution, rinsed, and thereafter immersed for 5 minutes in an aqueous solution containing 1.8% of sulfuric acid and 1.4% of hydrogen peroxide to neutralize the remaining chromium. This neutralization treatment is repeated using another neutralizing solution having the same composition. Finally, the fourth stage product 40 is washed with water for 2 minutes.

As a result of the above-described treatments for etching, a circuit pattern forming area on the surface of the fourth stage product 40 was rendered porous and hydrophilic and the catalyst present on this particular area was exposed. Accordingly, the area on the surface of the fourth stage product 40, which had been smooth and glossy before the treatments, became mat. That is, the surface of 3a as a ridgy projection and the internal peripheral surface 3d, each constituting a portion of the second stage product composed of a material to be attacked by an acid, were etched as described above, but the surface of the third stage product 4 composed of a material resistant to an acid, was not etched.

The formation of an electroconductive circuit was performed in the same manner as in Example 1.

EXAMPLE 3

Figure 9:
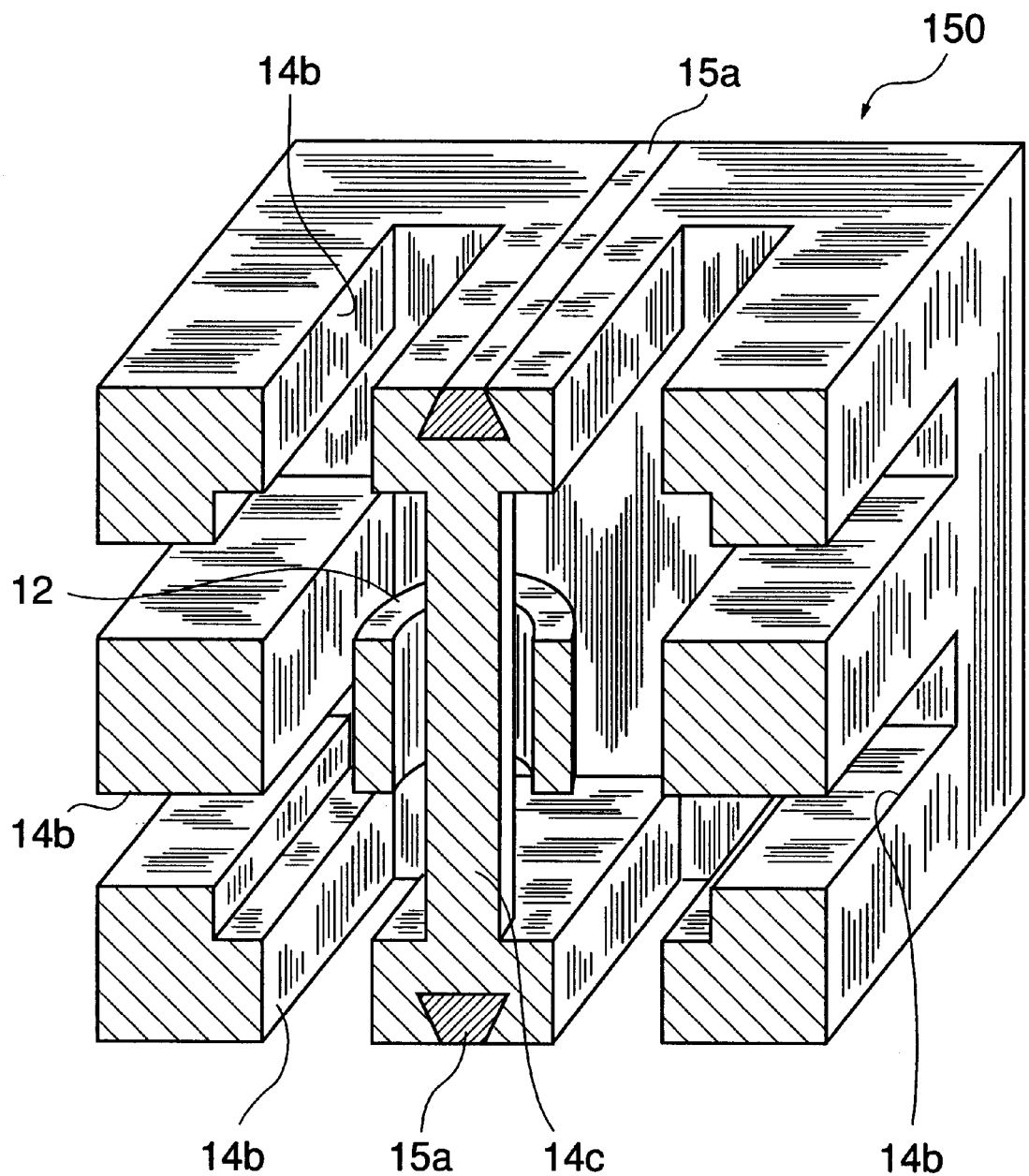

(a) At a first molding step, a cylindrical movable part 12 is produced. As shown in FIG. 9, the movable part 12 may be cylindrical or a tube having a polygonal cross section. Examples of the material for the movable part 12 include metals, ferrite and thermosetting synthetic resins, as long as the material withstands the condition for the injection molding of a core at the second molding step to obtain the core for use at the subsequent step.

Figure 6:
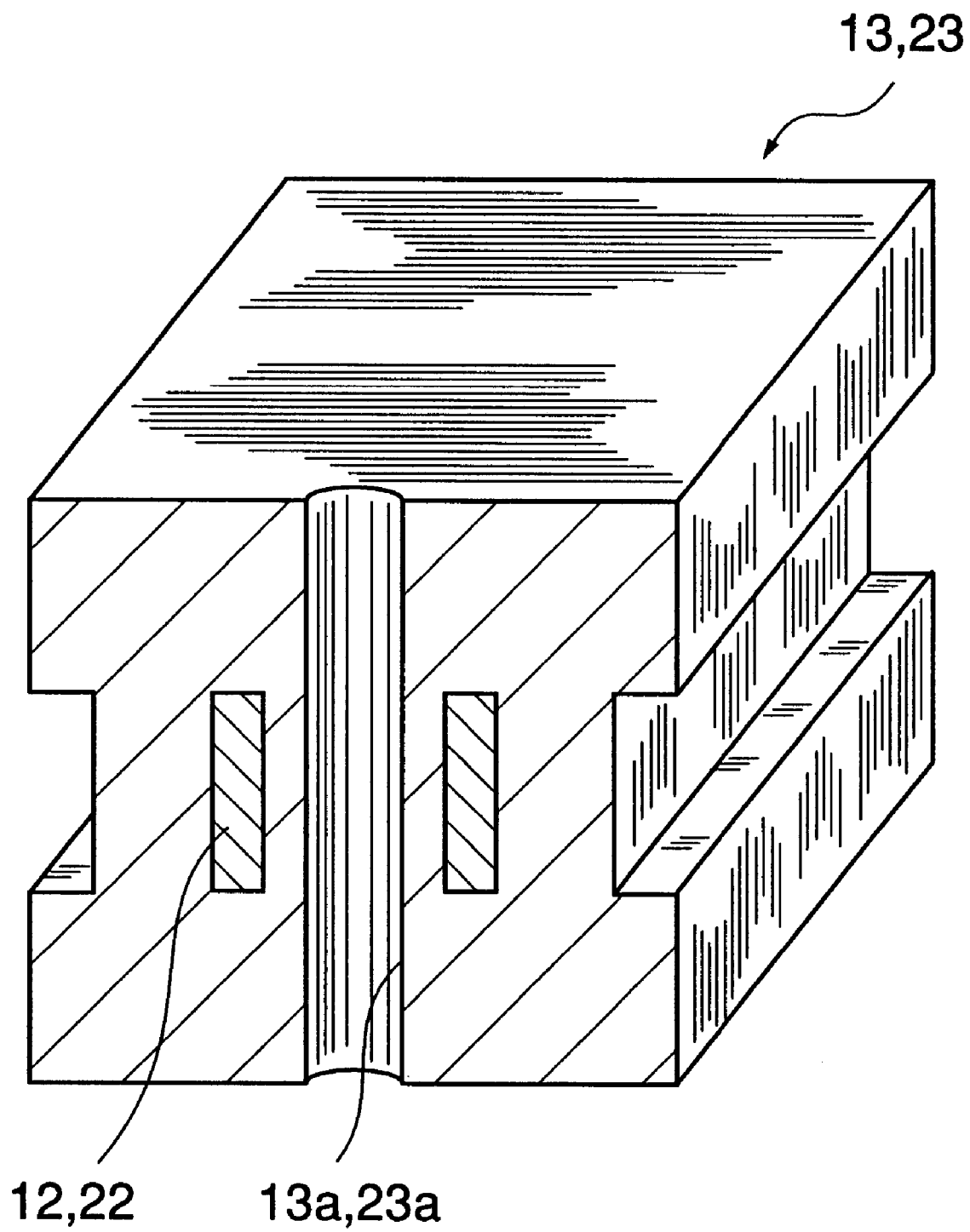
FIGS. 6–11 illustrate the manufacturing processes described in Example 3.

(b) At the second molding step, a core 13 having the movable part 12 embedded therein is produced, as shown in FIG. 6. The external configuration of the core 13 corresponds to the internal configuration of an electronic part 11 as a final product and has a structure in which a hollow portion 13a extends in upward and downward directions through the core 13 and the moving part 12 in embedded so as to surround the external peripheral surface of the hollow portion 13a. The procedure for producing the core 13 comprises creating a mold cavity having a configuration, which corresponds to the complicated internal configuration of the electronic part and which has an axis through the central portion of the configuration, between the opposed surfaces of ordinary upper and lower mold units (not shown), inserting the movable part 12 so as to engage with the axis in the cavity and thereafter injecting a polyvinyl alcohol-based resin containing an oxyalkylene group, which is identical to that employed in Examples 1 and 2 and is exemplified by "ECOMATY AX", at a predetermined pressure into the cavity by injection molding. The injection molding condition for this step is the same as in Example 1.

Figure 7:
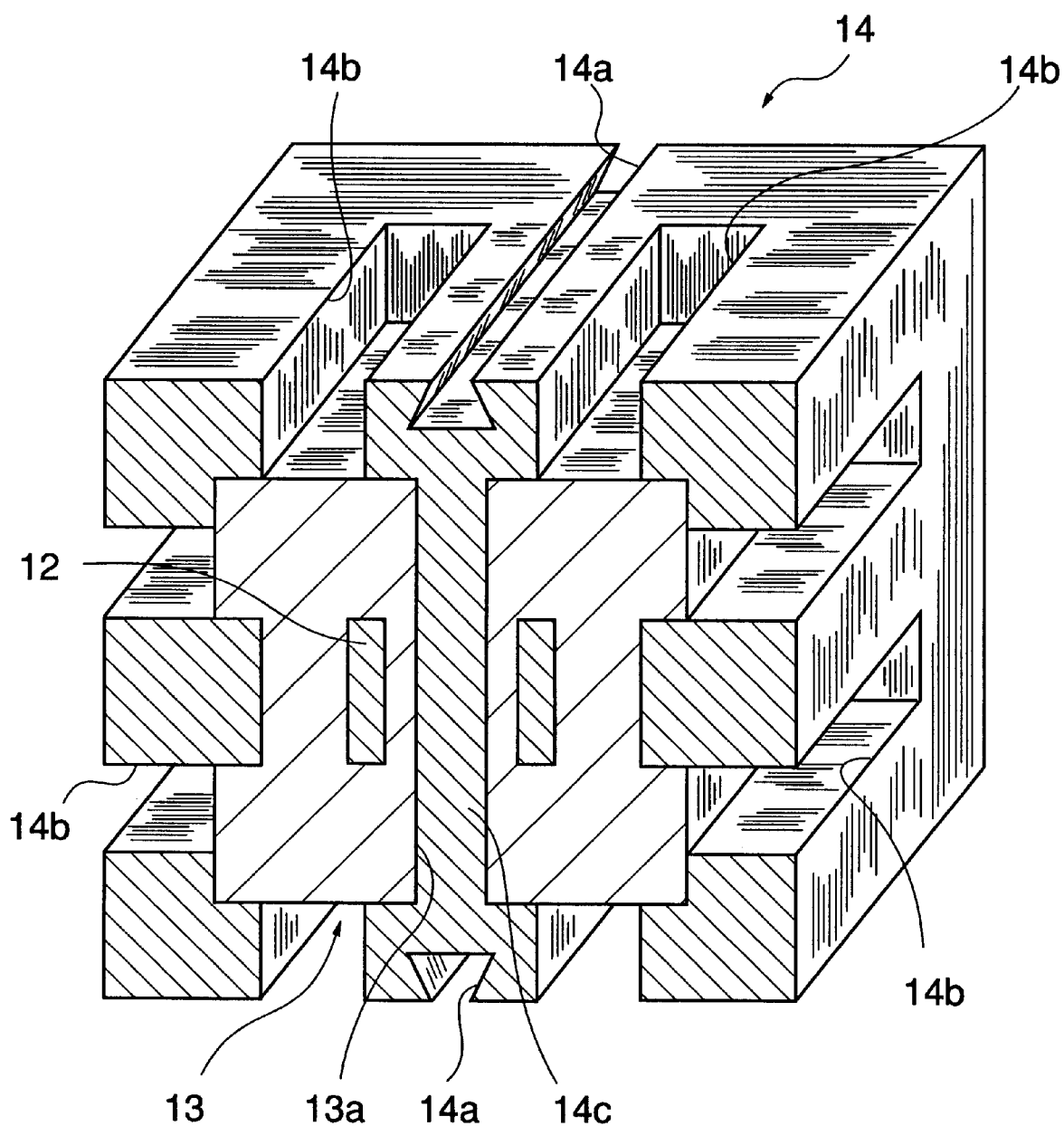

(c) The third molding step is intended for producing a second product 14 having the core 13 inserted therein as shown in FIG. 7. The procedure for producing the second product 14 comprises creating a mold cavity having a configuration, which corresponds to the external configuration having concave grooves 14a as a circuit pattern forming area on the surface of an electronic part 11 as a final product and has openings 14b . . . where the core is partly exposed, between the opposed surfaces of ordinary upper and lower mold units (not shown), inserting the core 13 and thereafter injecting a highly heat-resistant thermoplastic resin, which is a nonmetallization-grade resin and is, for example, a nonmetallization-grade liquid crystalline polymer employed in Example 1 exemplified by "VECTRA LCX364" (tradename) into the cavity by injection molding at a predetermined pressure. According to this step, the second product 14 is produced which has the structure where the core 13 having the embedded movable part 12 is inserted and where the central axis 14c extends through the hollow portion 13a.

Figure 8:
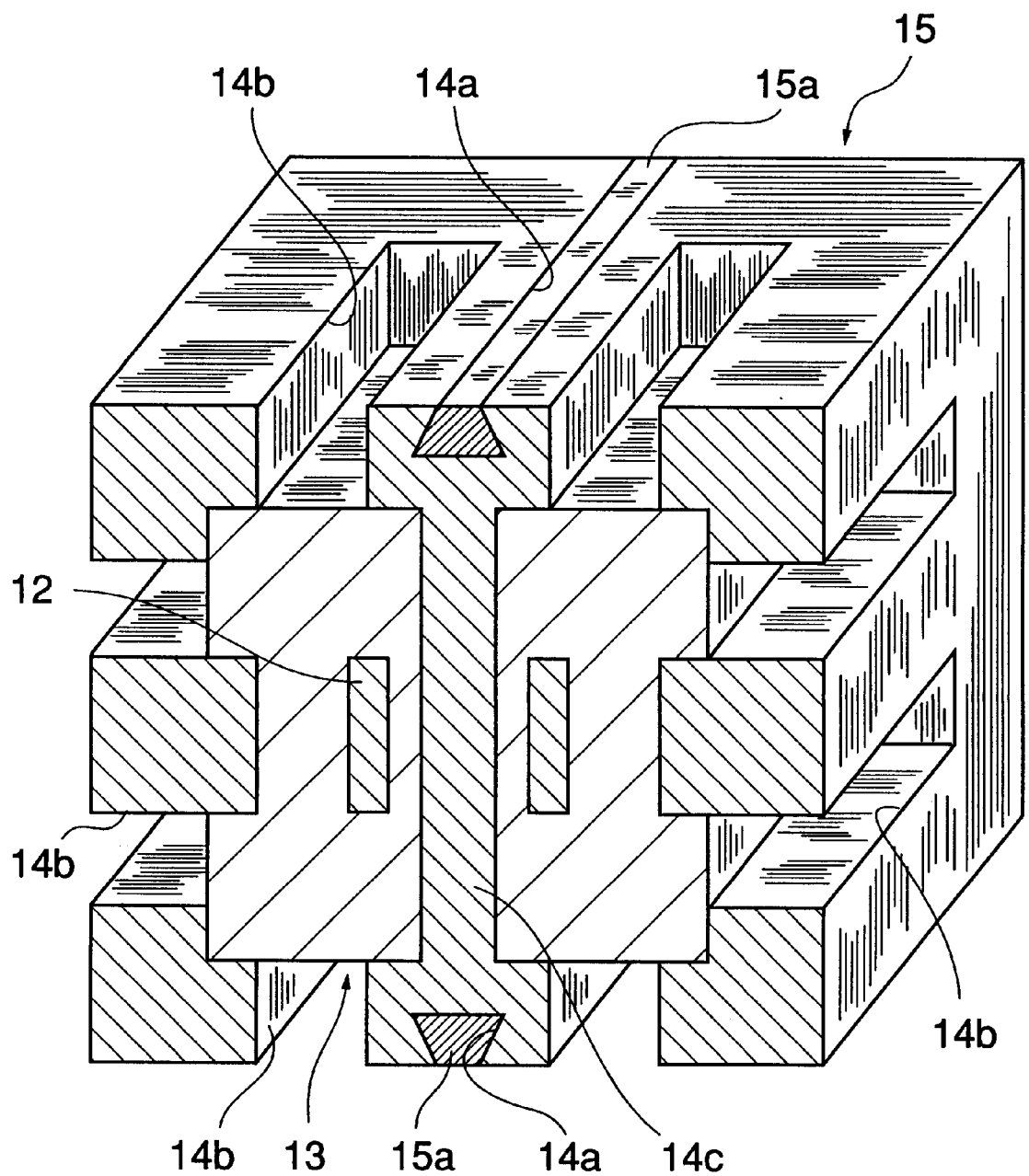

An example of injection molding condition at this step is given below.
Injection Material: "VECTRA LCX 364"
Cylinder Temperature: 300-C.
Mold Temperature: 100-C.
Injection Pressure: 600 Kg/cm2
Cooling Time: 15 seconds (d) According to the fourth molding step, a third stage product 15, which is shown in FIG. 8, is produced. The procedure for producing the third stage product 15 comprises creating a mold cavity, which corresponds to the external configuration of an electronic part as a final product, between the opposed surfaces of ordinary upper and lower mold units (not shown), inserting the second product 14 into the cavity and thereafter injecting a metallization-grade liquid crystalline polymer, which is the same polymer containing a catalyst as that employed in Example 1, e.g., "VECTRA C810" (tradename) containing a catalyst, into the cavity encircling the second stage product by injection molding at a predetermined pressure. This step provides the third product 15 having the circuit pattern forming areas 15a in the concave grooves 14a on the surface of the second product 14 which has the inserted core 13 having the embedded movable part 12 and which has the central axis 14c extending through the hollow portion 13a. The injection molding condition for this step is the same as that in Example 1.

(e) Next, the fifth molding step is a dissolution step for producing the fourth product 150 which is shown in FIG. 9 and is obtained by dissolving away the core 2 from the third stage product 15. The third stage product 15, which is produced at the fourth molding step, is placed in hot water and is heated to a temperature from 80 to 100-C. Since the above-mentioned liquid crystalline polymers, i.e., both of "VECTRA LCX368" and "VECTRA C810", have a thermal deformation temperature of 200-C. or higher, these liquid crystalline polymers undergo no change although the core 13 made from "ECOMATY AX" (tradename) is dissolved away from the openings 14b . . . into hot water by heating it to a temperature from 80 to 100-C. By this treatment, a fourth stage product 150 shown in FIG. 9 is produced which has a structure where the movable part 12 is engaged with the central axis 14c in a rotatable manner and axially movable manner and which has the circuit pattern forming areas 15a exposed on the surface thereof.

Figure 10:
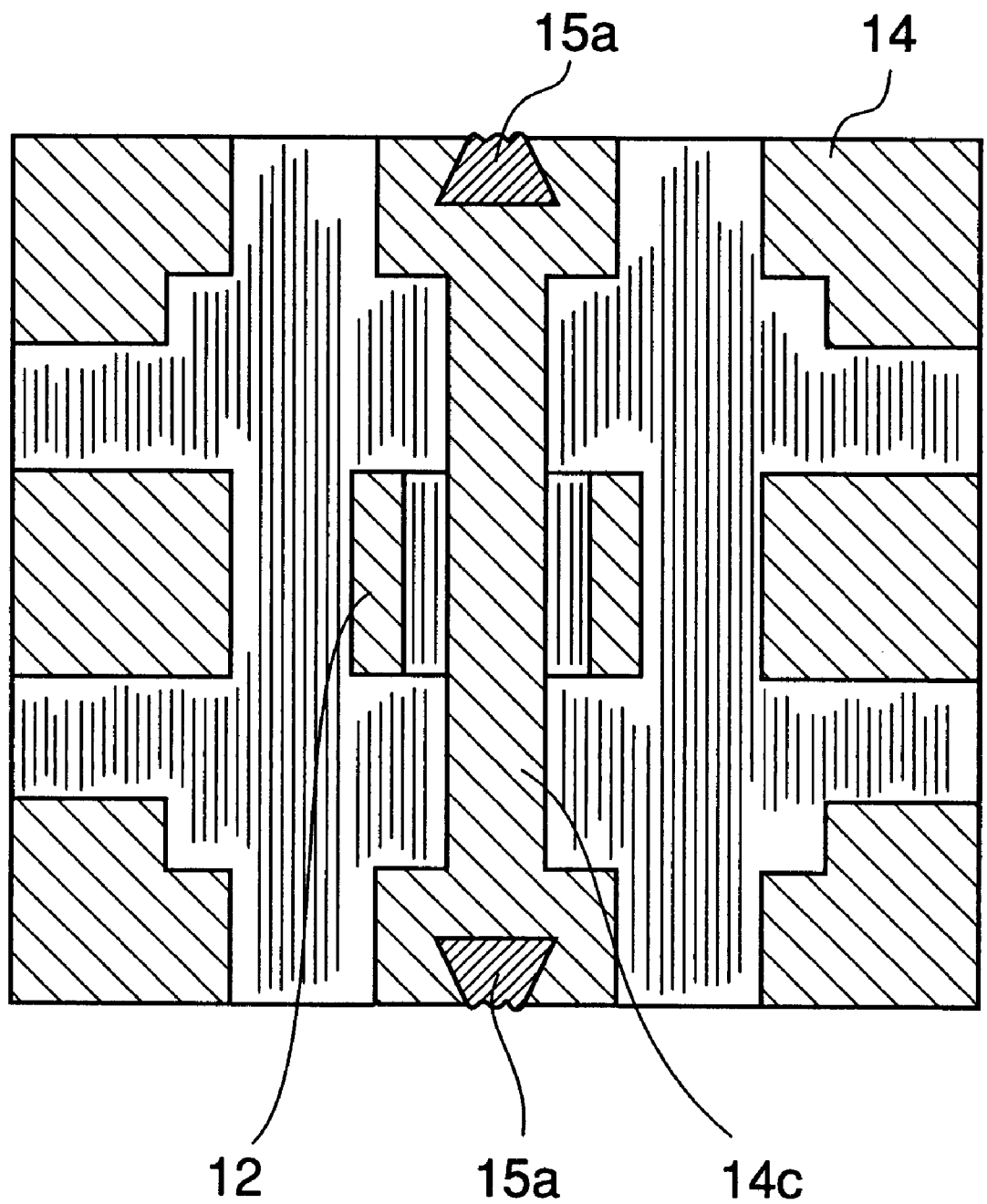
Figure 11:
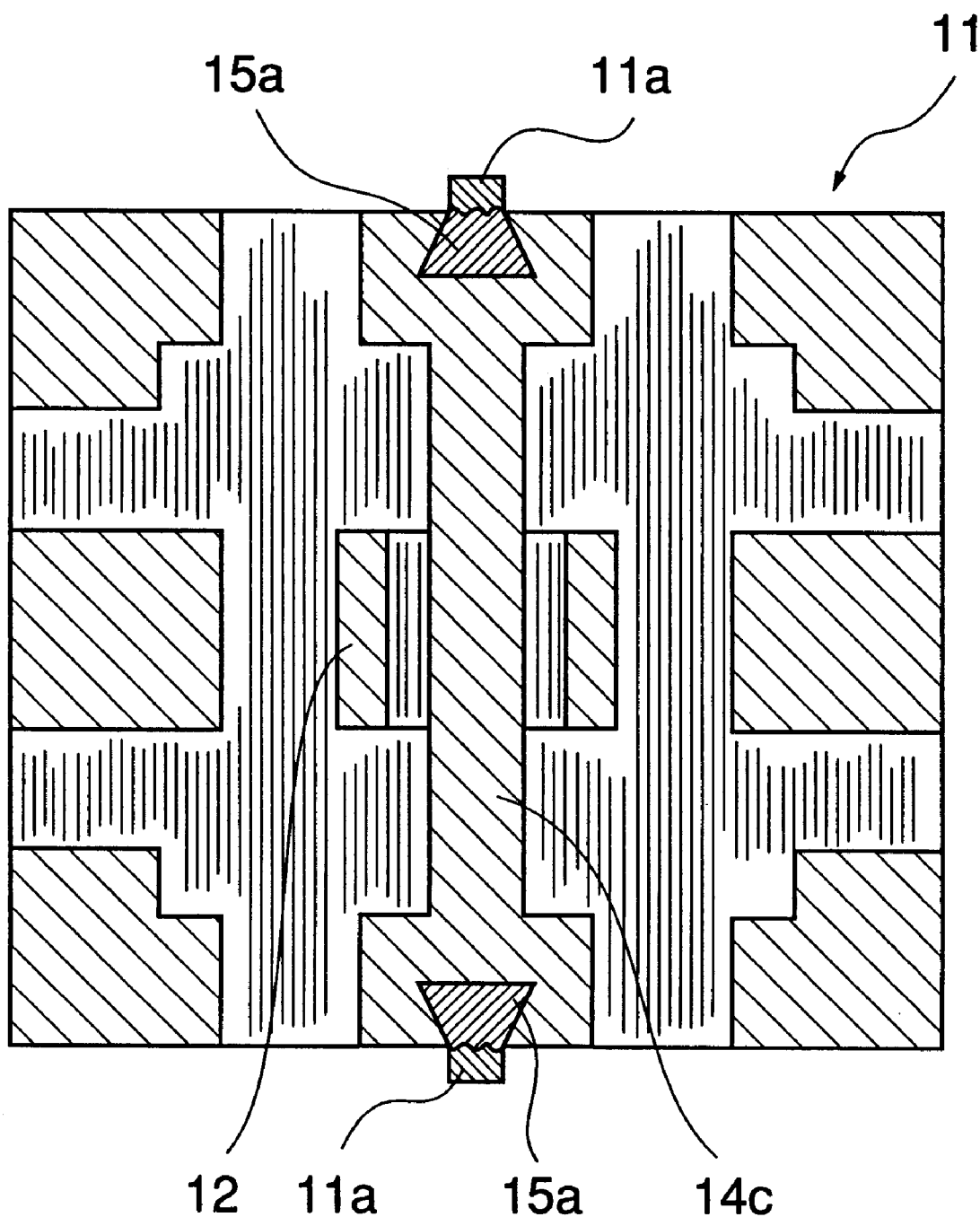

(f) Finally, the sixth molding step comprises roughening (etching) the surface of the fourth stage product 150, which is obtained after the dissolution step, as shown in FIG. 10 and thereafter forming an electroconductive circuit on the roughened surface as shown in FIG. 11 to produce an electronic part 11. For example, the etching is carried out by immersing the fourth stage product 150, which is obtained after the dissolution step and is shown in FIG. 9, for a predetermined time in an alkaline aqueous solution which contains sodium hydroxide or potassium hydroxide at a predetermined concentration and is kept at a temperature from 50 to 90-C. Although the areas 15a, which is to be a circuit pattern, are etched (FIG. 10 shows the etched surface in an exaggerated manner), the surface of the second product 14 is not etched and remains smooth. At the metallization, a copper layer or a nickel layer is chemically deposited on the surface 15a, which is to be a circuit pattern and which is exposed and is made from a material containing a catalyst, as shown in FIG. 11 in an exaggerated manner so that the electroconductive circuits 11a are formed. Then, the article is subjected to a heat treatment to remove the water remaining in the inside of the article and the electroconductive circuit forming step completes. As described above, since the area designed for a circuit pattern is made from a material containing a catalyst and is capable of being metallized whereas the other area is incapable of being metallized, it is possible to etch and thereafter metallize only the desired site easily.

In Example 3, examples of the nonmetallization-grade, highly heat-resistant thermoplastic resin, which is used at the third molding step, include polyphenylene sulfide (PPS) in addition to the aforesaid "VECTRA LCX364". Further, examples of the metallization-grade, highly heat-resistant thermoplastic resin, which is used at the fourth molding step and contains a catalyst, include a highly heat-resistant thermoplastic resin incorporated with a precious metal catalyst for electroless deposition, such as palladium, gold or silver, in addition to the aforesaid "VECTRA C810". An example is PPS incorporated with 0.1% by weight of palladium.

EXAMPLE 4

(a) A first molding step is a part producing step and a cylindrical movable part 22 (shown in FIG. 6), which has the same configuration as in Example 3, is produced from the same material as in Example 3.

(b) The second molding step is intended for producing a core 23 from a polyvinyl alcohol-based resin containing an oxyalkylene group, which is exemplified by "ECOMATY AX" (tradename), as shown in FIG. 6 of Example 3. The core 23 has a structure which has an axially extending hollow portion 23a and the movable part 22 embedded so as to surround the external peripheral surface of the hollow portion. The core 23 is produced in the same manner as for the second molding step in Example 3 including the injection molding condition.

Figure 12:
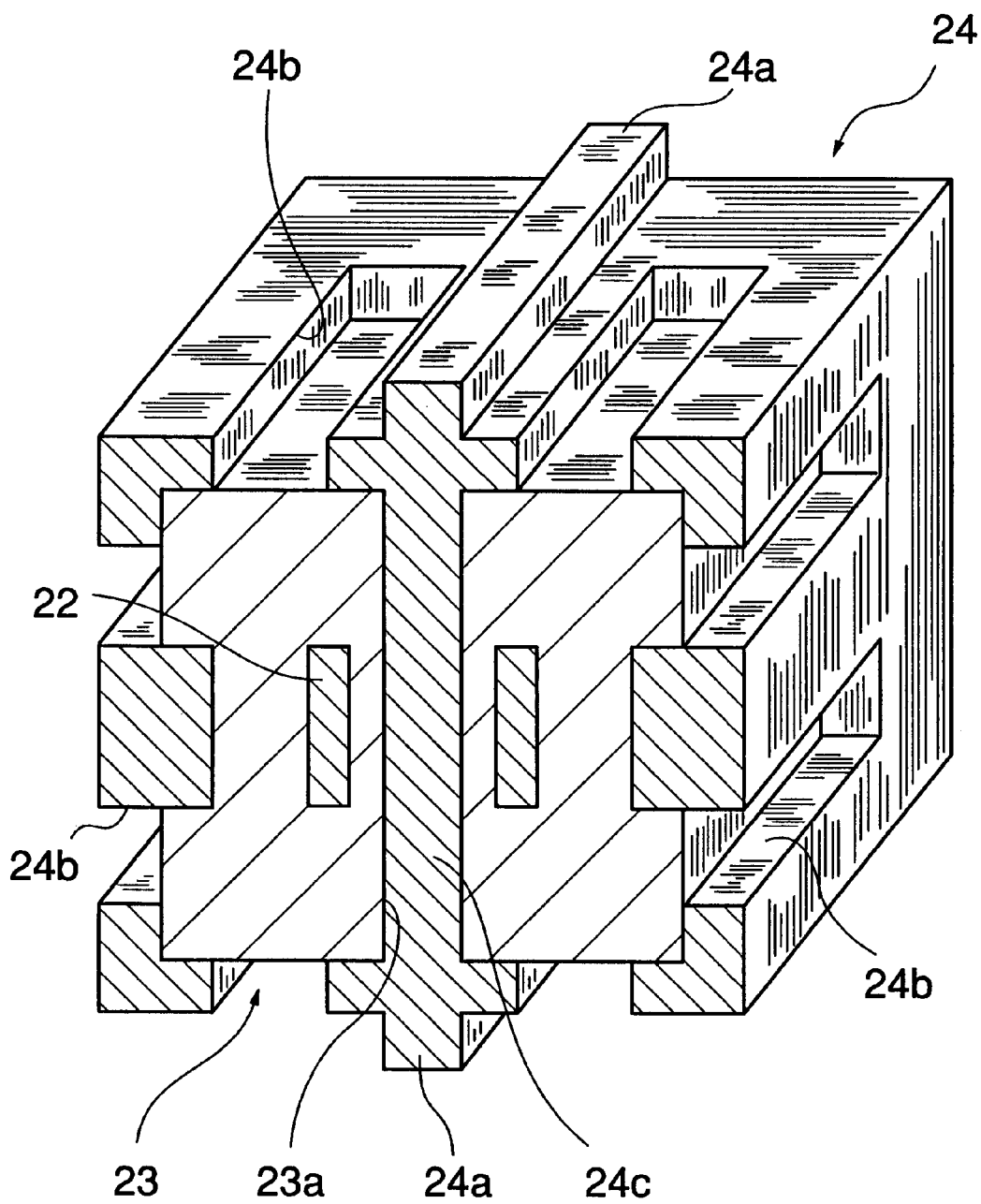
FIGS. 12–16 illustrate the manufacturing processes described in Example 4.

(c) The third molding step is intended for producing a second product 24 having the core 23 inserted therein as shown in FIG. 12. The procedure for producing the second product 24 comprises creating a mold cavity having a configuration, which corresponds to the external configuration having ridgy projections 24a as a circuit pattern forming area on the surface of an electronic part 21 as a final product and has openings for discharge 24b . . . where the core is partly exposed, between the opposed surfaces of ordinary upper and lower mold units (not shown), inserting the core 23 into the cavity and thereafter injecting a highly heat-resistant thermoplastic resin, which is a metallization-grade resin containing a catalyst and is, for example, a metallization-grade liquid crystalline polymer employed at the fourth molding step in Example 3 exemplified by "VECTRA C810" containing a catalyst into the cavity by injection molding at a predetermined pressure. The injection molding condition for the second product 24 is the same as for the fourth molding step in Example 3 (also the same as in Example 1).

Figure 13:
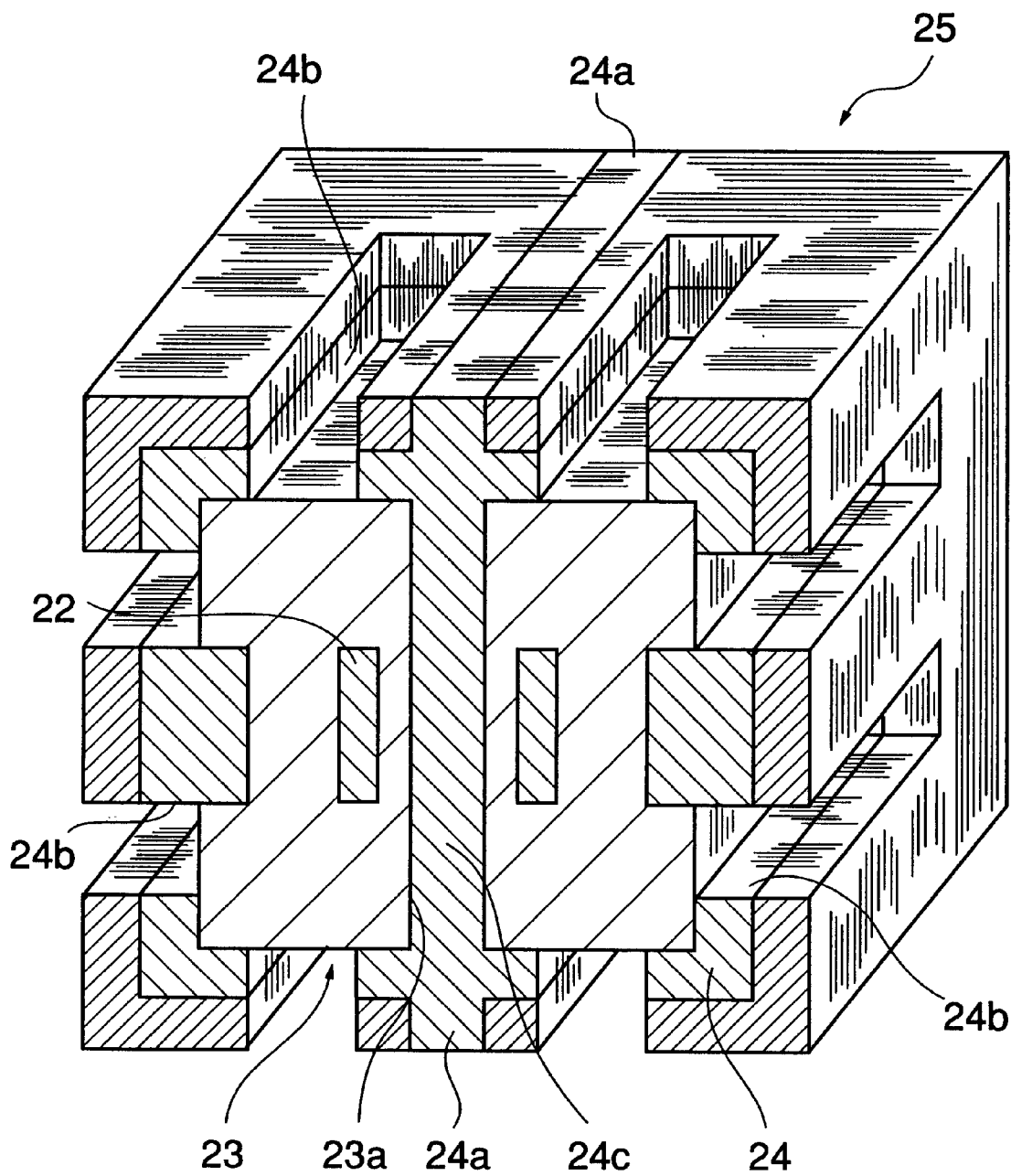

(d) According to the fourth molding step, a third stage product 25, which is shown in FIG. 13, is produced. The procedure for producing the third stage product 25 comprises creating a mold cavity, which corresponds to the external configuration of an electronic part as a final product, between the opposed surfaces of ordinary upper and lower mold units (not shown), inserting the second product 24 into the cavity and thereafter injecting a nonmetallization-grade liquid crystalline polymer, which is the same polymer as that employed at the third molding step in Example 3, e.g., "VECTRA LCX364" (tradename) into the cavity encircling the second stage product 24 by injection molding at a predetermined pressure. This step provides the third product 25 having the inserted second stage product 24 so that the core 23 inserted therein has the movable part 22 embedded therein and the central axis 24c extends through the axially extending hollow portion 23a and that the ridgy projections 24a of the second stage product 24 are exposed but the other surface of the second stage product 24 is covered. The injection molding condition for this step is the same as that of the third molding step in Example 3.

Figure 14:
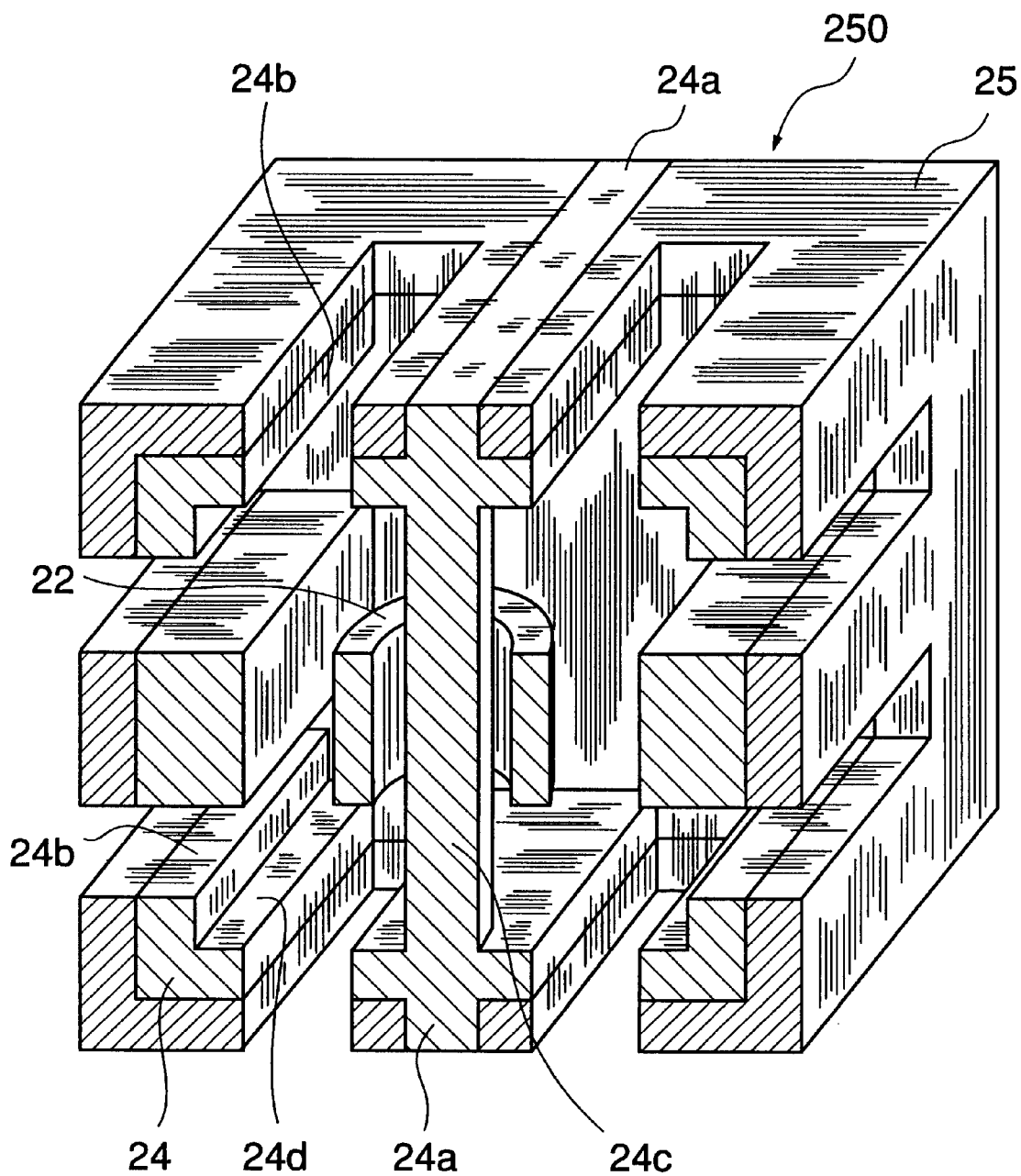

(e) Next, the fifth molding step is a dissolution step for producing the fourth product 250. FIG. 14 shows the fourth stage product 250 which is obtained by dissolving away the core 23 from the third stage product 25. The third stage product 25, which is produced at the fourth molding step, is placed in hot water and is heated to a temperature from 80 to 100-C. Since, as stated previously, these liquid crystalline polymers undergo no change, a fourth stage product 250 is produced which has a structure where the movable part 22 is engaged with the central axis 24c in a rotatable manner and axially movable manner and which has the circuit pattern forming areas 25a exposed on the external peripheral surface thereof and has the entire internal peripheral surface 24d and the central axis 24c, each of which is made from a metallization-grade liquid crystalline polymer, exposed within the structure.

Figure 15:
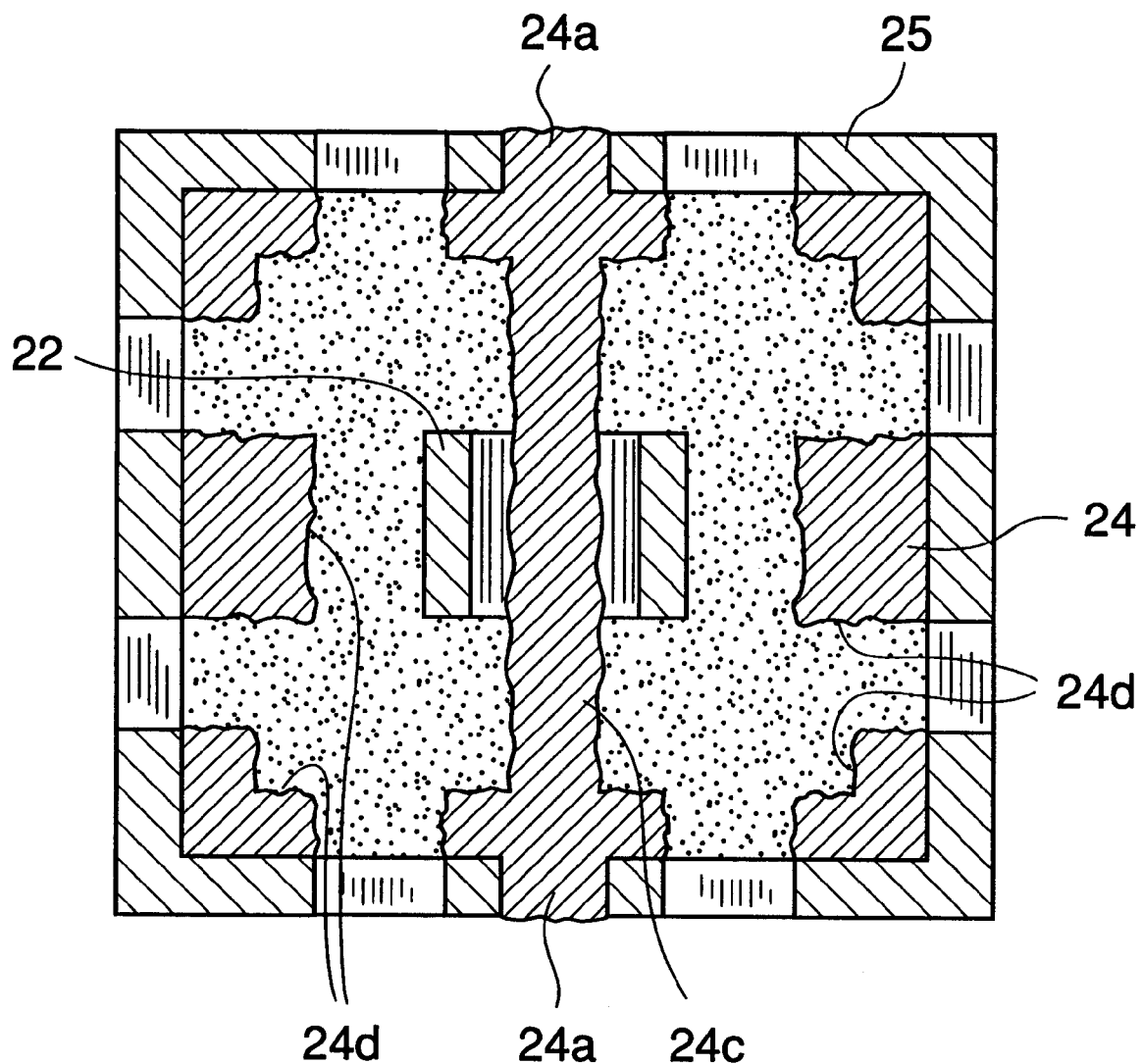
Figure 16:
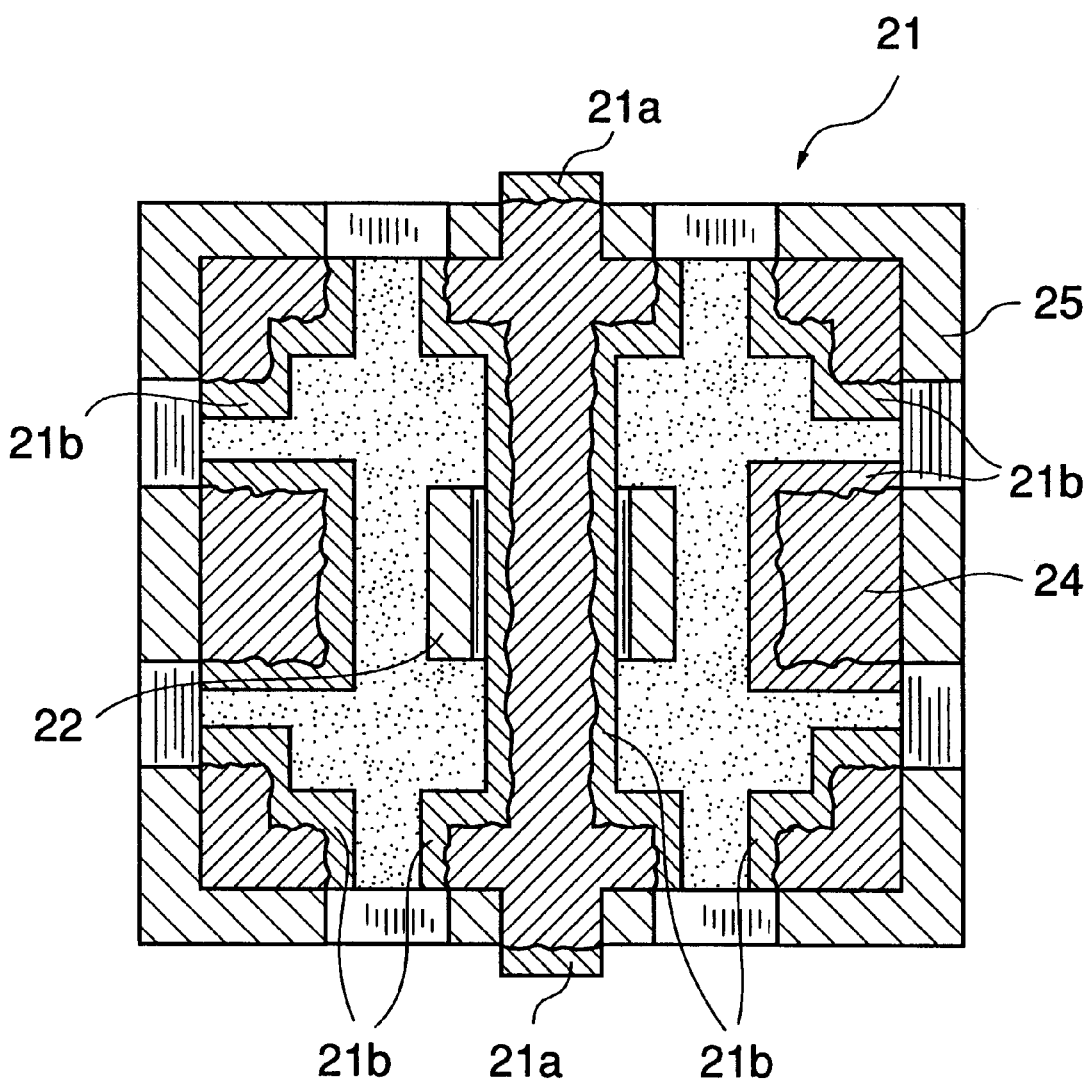

(f) Finally, the sixth molding step comprises roughening (etching) the surface of the fourth stage product 250, which is obtained after the dissolution step, as shown in FIG. 15 and thereafter forming an electroconductive circuit on the roughened surface as shown in FIG. 16 to produce an electronic part 21. For example, the etching is carried out by immersing the fourth stage product 250, which is obtained after the dissolution step and is shown in FIG. 14, for a predetermined time in an alkaline aqueous solution which contains sodium hydroxide or potassium hydroxide at a predetermined concentration and is kept at a temperature from 50 to 90 C. Although the ridgy areas 24a, which is to be a circuit pattern, the entire internal peripheral surface 24d and the external peripheral surface of the central axis 24c are etched as shown in FIG. 15 in an exaggerated manner, the surface of the second product 25 is not etched and remains smooth. At the metallization, a copper layer or a nickel layer is chemically deposited on the exposed and surface-roughened surfaces, i.e., the ridgy surface 24a, which is to be a circuit pattern, the entire internal peripheral surface 24 and the external peripheral surface of the central axis 24c, to thereby easily form electroconductive circuits 21a and an electroconductive layer 21b, respectively, on the entire internal peripheral surface 24d and on the external peripheral surface of the central axis 24c, as shown in FIG. 16 in an exaggerated manner. Then, the article is subjected to a heat treatment to remove the water remaining inside the article and accordingly the electroconductive circuit forming step completes. As described above, since the area designed for the formation of an electroconductive circuit and an electroconductive layer is made from a material containing a catalyst and is capable of being metallized whereas the other area is incapable of being metallized, it is possible to etch and thereafter metallize only the desired site easily.

EXAMPLE 5

Figure 17A:
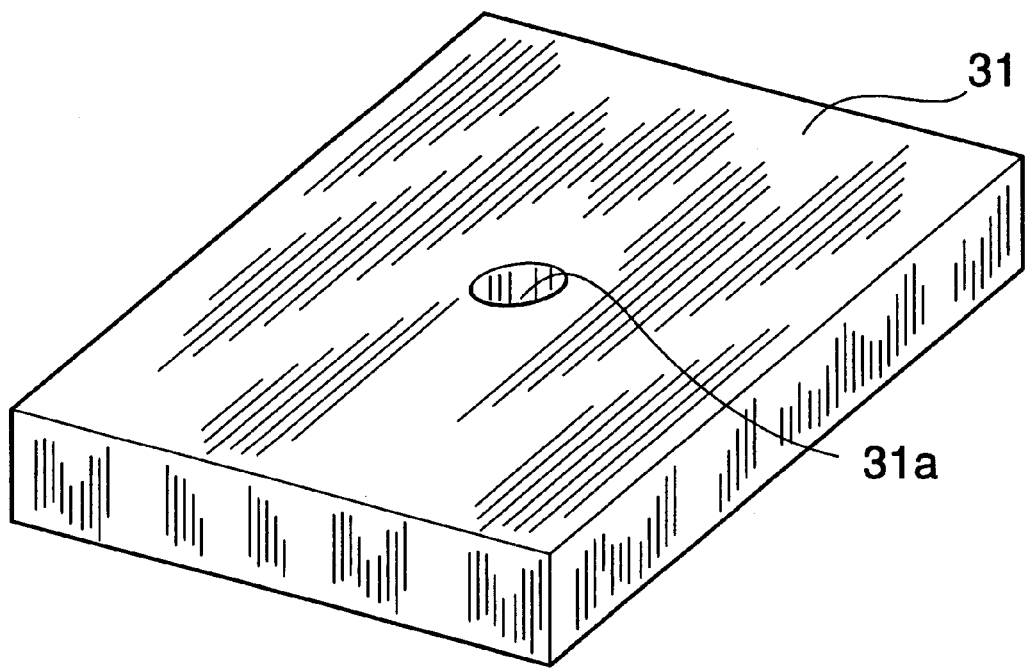
FIGS. 17 illustrates Example 5 to show another embodiment of the core, where (A) is a slant view of the upper half of core and (B) is a slant view of the lower half of core.
Figure 17B:
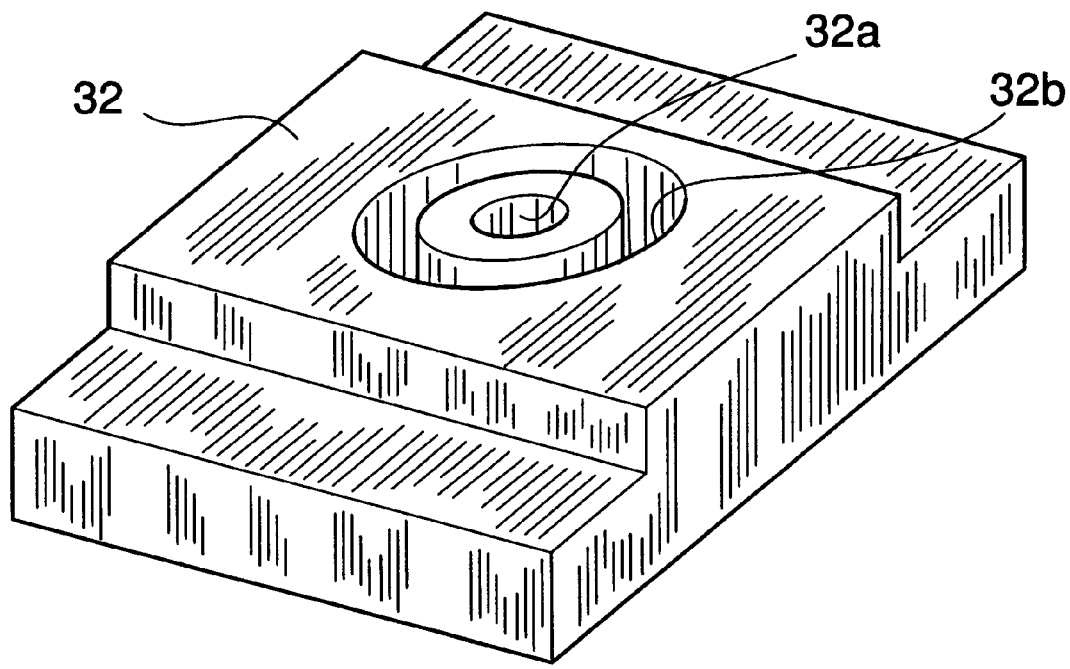

In Examples 3 and 4, the movable part is inserted into the mold cavity and then the injection molding operation is performed so that the core is integrally produced as shown in FIG. 6. In Example 5, however, the first molding step, at which the core is produced, is performed in an another way as shown in FIG. 17 wherein the core is produced by joining separate upper core half 31 and lower core half 32, each made from one and the same material. The upper core half 31 has a hollow portion 31a, while the lower core half 32 has a hollow portion 32a and a concave groove 32b which surrounds the external periphery of the hollow portion 32a and which is to engage with the movable part. The cylindrical movable part is inserted into the concave groove 32b of the lower core half 32 and thereafter the upper core half 31 is aligned and joined with the lower core half 32 so that the hollow portion 31a becomes continuous and coaxial with the hollow portion 32a. By this procedure, a core is produced which is substantially identical to the core illustrated in FIG. 6. The procedures, which are performed at the first molding step and at the steps from the third molding step onwards, are the same as in Examples 3 and 4.

What is claimed is:

1. A process for producing an electronic part, said process comprising:
   a first molding step of injecting a polyvinyl alcohol-based resin containing an oxyalkylene group into a mold cavity corresponding to the internal configuration of the electronic part to produce a core for the injection molding, wherein said resin has a melting point lower than that of a thermoplastic resin of the electronic part and has a solubility in water so that said polyvinyl alcohol-based resin easily dissolves in hot water;
   a second molding step of inserting the core into a mold cavity corresponding to the external configuration having a ridgy projection for a circuit pattern to be formed on the electronic part and thereafter injecting an aromatic polyester liquid crystalline polymer of a highly heat-resistant thermoplastic resin, whose surface can be roughened by an alkali and which contains a catalyst, at a predetermined pressure into the cavity to produce a second stage product which has the core inserted therein and has the circuit pattern forming area protruded as a ridge and which is provided with a discharge outlet;
   a third molding step of inserting the second product into a mold cavity corresponding to the external configuration of the electronic part and thereafter injecting an alkali-resistant, highly heat-resistant thermoplastic resin into the cavity encircling the second stage product by injection molding to produce a third stage product in which the circuit pattern forming area is exposed but all other surfaces are covered with the alkali-resistant, highly heat-resistant thermoplastic resin;
   a fourth molding step of immersing the third stage product in hot water under heating for dissolving away the core to thereby produce a fourth stage product;
   a fifth molding step of roughening the surface of the circuit pattern forming area exposed on the external peripheral surface of the fourth stage product and metallizing the roughened area to form an electroconductive circuit.

2. A process for producing an electronic part according to claim 1, wherein the alkali-resistant, highly heat-resistant thermoplastic resin is polyphenylene sulfide.

3. A process for producing an electronic part, comprising:
   a first molding step of producing a cylindrical movable part;
   a second molding step of producing a core for the injection molding from a polyvinyl alcohol-based resin containing an oxyalkylene group so that the core has a structure having an axially extending hollow portion and the movable part is embedded therein so as to surround the external peripheral surface of the axially extending hollow portion;
   a third molding step of creating a mold cavity having a configuration, which corresponds to the external configuration, having concave grooves for a circuit pattern forming area on the surface, of the electronic part and has openings where the core is partly exposed, inserting the core and thereafter injecting an aromatic polyester liquid crystalline polymer of a highly heat-resistant thermoplastic resin, which is a nonmetallization-grade resin, into the cavity by injection molding to produce a second stage product which has a structure having the core inserted therein and a central axis extending through the hollow portion;
   a fourth molding step of creating a mold cavity, which corresponds to the external configuration of the electronic part, inserting the second stage product into the cavity and thereafter injecting a metallization-grade liquid crystalline polymer, which contains a catalyst, into the cavity encircling the second stage product by injection molding to produce a third stage product having the circuit pattern forming areas in the concave grooves on the surface of the second product;
   a fifth molding step of heating the third stage product in hot water for dissolving away the core from the third stage product to thereby produce a fourth stage product; and
   a sixth molding step of roughening the surface of the circuit pattern forming area exposed on the surface of the fourth stage product and thereafter metallizing the roughened surface to form an electroconductive circuit.

4. A process for producing an electronic part according to claim 3, wherein the metallization-grade, highly heat resistant thermoplastic resin contains a catalyst and is a metallization-grade, aromatic polyester liquid crystalline polymer containing a catalyst.

5. A process for producing an electronic part according to claim 3, wherein the metallization-grade, highly heat resistant thermoplastic resin contains a catalyst and is polyphenylene sulfide incorporated with a precious metal catalyst for electroless deposition.

6. A process for producing an electronic part according to claim 3, wherein the second molding step comprises creating a mold cavity, which corresponds to the complicated internal configuration of the electronic part and has an axis extending through the central portion, inserting the movable part for engagement with the axis and thereafter injecting the injection material into the cavity to produce the core.

7. A process for producing an electronic part according to claim 3, wherein the second molding step comprises producing separately a first half and a second half of the core, which core has an axially extending hollow portion through the central portion provided with a concave groove that accommodates the movable part to surround the hollow axial portion and which has a configuration corresponding to the complicated internal configuration of the electronic part, and thereafter inserting the movable part into the groove to thereby join the first half and the second half of the core together.

8. A process for producing an electronic part, comprising:
   a first molding step of producing a cylindrical movable part;
   a second molding step for producing a core from a polyvinyl alcohol-based resin containing an oxyalkylene group, which core is to be used at a subsequent injection molding step so that the core has a structure having an axially extending hollow portion and the movable part is embedded therein in such a manner that the movable part surrounds the external peripheral surface of the axially extending hollow portion;
   a third molding step of creating a mold cavity having a configuration, which corresponds to the external configurations having ridgy projections as a circuit pattern forming area on the surfaces of the electronic part and has discharge openings where the core is partly exposed, inserting the core and thereafter injecting a highly heat-resistant thermoplastic resin, an aromatic polyester liquid crystalline polymer which is a metallization-grade resin and containing a catalyst, into the cavity by injection molding to produce a second product which has a structure having the core inserted therein and a central axis extending through the hollow portion;

a fourth molding step of creating a mold cavity, which corresponds to the external configuration of the electronic part, inserting the second product into the cavity and thereafter injecting a nonmetallization-grade liquid crystalline polymer into the cavity to encircle the second stage product by injection molding to produce a third stage product having the exposed ridgy projections of the second stage product;

a fifth molding step of heating the third stage product in hot water for dissolving away the core from the third stage product to thereby produce a fourth stage product; and a sixth molding step of roughening the surface of the circuit pattern forming area exposed on the surface of the fourth stage product and the internal peripheral surface and thereafter metallizing the roughened surface to form an electroconductive circuit.

9. A process for producing an electronic part according to claim 8, wherein the nonmetallization-grade, highly heat resistant thermoplastic resin is a nonmetallization-grade, aromatic polyester liquid crystalline polymer.

10. A process for producing an electronic part according to claim 8, wherein the nonmetallization-grade, highly heat resistant thermoplastic resin is polyphenylene sulfide.

11. A process for producing an electronic part according to claim 8, wherein the metallization-grade, highly heat resistant thermoplastic resin, which contains a catalyst, is a metallization-grade, aromatic polyester liquid crystalline polymer containing a catalyst.

12. A process for producing an electronic part according to claim 8, wherein the metallization-grade, highly heat resistant thermoplastic resin, which contains a catalyst, is polyphenylene sulfide incorporated with a precious metal catalyst for electroless deposition.

13. A process for producing an electronic part according to claim 8, wherein the second molding step comprises creating a mold cavity, which corresponds to the complicated internal configuration of the electronic part and has an axis extending through the central portion, inserting the movable part for engagement with the axis and thereafter injecting the injection material into the cavity to produce the core.

14. A process for producing an electronic part according to claim 8, wherein the second molding step comprises producing separately a first half and a second half of the core, which core has an axially extending hollow portion through the central portion provided with a concave groove that accommodates the movable part to surround the hollow axial portion and which has a configuration corresponding to the complicated internal configuration of the electronic part, and thereafter inserting the movable part into the groove to thereby join the first half and the second half of the core together.

* * * * *